US006444486B1

United States Patent
Kwak et al.

(10) Patent No.: US 6,444,486 B1
(45) Date of Patent: Sep. 3, 2002

(54) SEMICONDUCTOR LASER DIODE INCLUDING RIDGE WAVE GUIDE AND METHOD OF MANUFACTURING THE SAME

(75) Inventors: Joon-seop Kwak, Kyungki-do; Jae-hee Cho, Seoul, both of (KR)

(73) Assignee: Samsung Electro-Mechanics Co., Ltd. (KR)

( * ) Notice: Subject to any disclaimer, the term of this patent is extended or adjusted under 35 U.S.C. 154(b) by 0 days.

(21) Appl. No.: 09/925,326

(22) Filed: Aug. 10, 2001

(30) Foreign Application Priority Data

Dec. 20, 2000 (KR) ......................................... 2000-79184

(51) Int. Cl.⁷ ........................ H01L 21/00; H01L 29/04; H01L 31/036; H01L 29/40
(52) U.S. Cl. .............................. 438/47; 372/50; 372/44
(58) Field of Search .............................. 438/47; 372/50, 372/44

(56) References Cited

U.S. PATENT DOCUMENTS

| | | | | |
|---|---|---|---|---|
| 4,827,482 A | * | 5/1989 | Towe et al. ................. | 372/44 |
| 5,193,098 A | * | 3/1993 | Welch et al. ................. | 372/46 |
| 5,872,022 A | * | 2/1999 | Motoda et al. ............... | 438/39 |
| 6,256,331 B1 | * | 7/2001 | Kitoh et al. .................. | 372/46 |
| 6,324,199 B1 | * | 11/2001 | Capasso et al. .............. | 372/45 |
| 6,326,646 B1 | * | 12/2001 | Baillargeon et al. ......... | 257/94 |

* cited by examiner

*Primary Examiner*—Olik Chaudhuri
*Assistant Examiner*—William C Vesperman
(74) *Attorney, Agent, or Firm*—Burns, Doane, Swecker & Mathis, LLP

(57) ABSTRACT

A semiconductor laser diode having a ridge wave guide and a method of manufacturing the same are provided. The semiconductor laser diode in which a ridge protruding perpendicularly to an active layer is formed in one of first and second material layers in which stimulated emission occurs, the first and second material layers being formed over and under the active layer, respectively, and having lower refractive indices than the active layer, the semiconductor laser diode contacting an electrode via the ridge, wherein the side of the ridge is made up of at least two portions having different gradients.

21 Claims, 5 Drawing Sheets

SEMICONDUCTOR LASER DIODE INCLUDING RIDGE WAVE GUIDE AND METHOD OF MANUFACTURING THE SAME

Priority is claimed to Korean Patent Application No. 00-79184, filed Dec. 20, 2000, herein incorporated by reference.

BACKGROUND OF THE INVENTION

1. Field of the Invention

The present invention relates to a semiconductor laser diode and a method of manufacturing the same, and more particularly, to a semiconductor laser diode including a ridge wave guide and a method of manufacturing the same.

2. Description of the Related Art

Semiconductor lasers are widely used in a communications field such as optical communications or in apparatuses such as compact disk players (CDPs) or digital versatile disc players (DVDPs), as means for transmitting data or writing and reading data.

As described above, semiconductor lasers are widely used for various reasons, such as their ability to maintain the laser characteristics within an appropriate restricted space, the fact that they can be miniaturized, and, above all, for the reason that they have a small value of critical current for laser oscillation.

Due to an increase in the industrial field of semiconductor laser use, the need for of semiconductor lasers is increasing, and also semiconductor lasers having a small critical current value are in demand.

Accordingly, semiconductor lasers which have a reduced critical current value have been developed or are being currently developed. An example of the above-described semiconductor lasers is shown in FIG. 1, which shows a conventional semiconductor laser diode including a ridge wave guide in order to reduce the value of critical current for laser oscillation.

Referring to FIG. 1, an n-GaN layer 12 is included on a sapphire substrate 10. The n-GaN layer 12 can be divided into first and second regions R1 and R2. An n-AlGaN/GaN layer 24, an n-GaN waveguide layer 26, an active layer (InGaN layer) 28, a p-GaN waveguide layer 30 and a p-AlGaN/GaN layer 32 are sequentially formed on the first region R1. The refractive indices of the n-AlGaN/GaN layer 24 and the p-AlGaN/GaN layer 32 are lower than those of the n-GaN waveguide layer 26 and the p-GaN waveguide layer 30. Also, the refractive indices of the n-GaN waveguide layer 26 and the p-GaN waveguide layer 30 are lower than that of the active layer 28. The p-AlGaN/GaN layer 32 has a ridge shape, the upper middle portion of which protrudes. The sides of the protruding portion are perpendicular to the surface surrounding the protruding portion, and the top of the protruding portion is perpendicular to the sides and flat. The width of current flowing to the p-AlGaN/GaN layer 32 is restricted by the protruding portion. As a result, a resonance region for laser oscillation in the active layer 28 is defined. A p-GaN layer 34 is formed on the top of the protruding portion of the p-AlGaN/GaN layer 32. The exposed entire surface of the p-AlGaN/GaN layer 32 is covered with a protective layer 36. Both ends of the p-GaN layer 34 excluding the middle portion which is a current passage contact the protective layer 36. A p-type electrode 38 is formed on the protective layer 36 and contacts the exposed entire surface of the p-GaN layer 34.

The second region R2 of the n-GaN layer 12, which is lower than the first region R1, has an n-type electrode 40 formed thereon.

As described above, in a conventional laser diode, the resonance width is restricted by the ridge structure, so that the value of critical current for laser oscillation is reduced compared to the case of a non-ridge structure. However, as shown in FIG. 2, when the height of a ridge is made low by shallow etching for forming the ridge, the resistance of the p-AlGaN/GaN layer 32 and the resistance of the p-GaN layer 34 greatly increase, and current flowing via the p-GaN layer 34 spreads over the width of a ridge before it reaches the active layer 28. As a result, a resonance region Al (FIG. 2) widens, so that a critical current value for laser oscillation may increase. On the other hand, as shown in FIG. 3, when a ridge is high and the p-AlGaN/GaN layer 32 around the ridge is thin, due to deep etching for forming a ridge, spreading of current can be prevented, but the portion under the ridge is included in an optical wave guide during laser resonance. Thus, light loss may occur, and, accordingly, the value of critical current may increase.

SUMMARY OF THE INVENTION

To solve the above problem, an objective of the present invention is to provide a semiconductor laser diode including a ridge wave guide designed to increase a resonance width while maintaining the value of critical current and to prevent light loss which occurs due to the structure of a conventional ridge in which the portion under a ridge is included in an optical waveguide during resonance.

Another objective of the present invention is to provide a method of manufacturing the semiconductor laser diode.

To achieve the first objective, the present invention provides a semiconductor laser diode in which a ridge protruding perpendicularly to an active layer is formed in one of first and second material layers in which stimulated emission occurs, the first and second material layers being formed over and under the active layer, respectively, and having lower refractive indices than the active layer, the semiconductor laser diode contacting an electrode via the ridge, wherein the side of the ridge is made up of at least two portions having different gradients. A portion of the ridge that is close to the active layer becomes wider as it gets closer to the active layer. The ratio of a portion C2 of the ridge, the width of which increases in the direction of the active layer, to a portion C1, the width of which is constant, C2/C1, is no greater than 2/1, preferably 1/2 or 1/3. The first material layer in which stimulated emission occurs includes: a first compound semiconductor layer formed on a substrate; a first cladding layer formed on the first compound semiconductor layer; and a first waveguiding layer formed on the first cladding layer, the first waveguiding layer having a greater refractive index than the first cladding layer. The second material layer in which stimulated emission occurs includes: a second waveguiding layer formed on the active layer; a second cladding layer formed on the second waveguiding layer, the second cladding layer having a smaller refractive index than the second waveguiding layer and including the ridge; and a second compound semiconductor layer formed on the entire upper surface of the ridge. An electrode having a different polarity from the electrode formed on the ridge is formed on the first compound semiconductor layer. The substrate, which is a highly resistive sapphire substrate, can be formed of silicon carbon SiC.

To achieve the second objective, the present invention provides a method of manufacturing a semiconductor laser diode, in which a ridge protruding perpendicularly to an active layer is formed in one of first and second material layers in which laser is emitted, the first and second material layers being formed over and under the active layer, respectively, and having lower refractive indices than the active layer, and an electrode is connected to the ridge, wherein the ridge is formed so that its side has at least two portions having different gradients. A portion of the ridge that is close to the active layer becomes wider as it gets closer to the active layer. The ridge is formed so that the ratio of a portion C2 of the ridge, the width of which gradually increases in the direction of the active layer, to a portion C1, the width of which is constant, C2/C1, is no greater than 2/1. More preferably, the ridge is formed so that the ratio C2/C1 of the portion C2 of the ridge, the width of which gradually increases in the direction of the active layer, to the portion C1, the width of which is constant, is 1/2 or 1/3.

The ridge is formed by the steps of: forming a mask pattern used to form the ridge, on the first material layer; etching the second material layer until the second material layer has a predetermined thickness, using the mask pattern as an etch mask; and removing the mask pattern. Here, the second material layer is etched by slant-radiating an ion beam onto the surface of the second material layer at a predetermined angle. The slant radiation angle is 10 to 70°, preferably, 30°. A first compound semiconductor layer is formed on a substrate. A first cladding layer is formed on the first compound semiconductor layer. A first waveguiding layer is formed on the first cladding layer, the first waveguiding layer having a greater refractive index than the first cladding layer. The second material layer in which stimulated emission occurs is formed by the steps of: forming a second waveguiding layer on the active layer; forming a second cladding layer on the second waveguiding layer, the second cladding layer having a smaller refractive index than the second waveguiding layer and including the ridge; and forming a second compound semiconductor layer on the entire upper surface of the ridge. An electrode having a different polarity from the electrode formed on the ridge is formed on the first compound semiconductor layer so that it is isolated from the active layer. An electrode having a different polarity from the electrode formed on the ridge is formed on the bottom surface of the substrate.

In a semiconductor laser diode having a ridge wave guide according to the present invention, a ridge is made up of a portion whose width is uniform and a portion which is connected from the portion having a uniform width and whose width increases in the direction toward an active layer. Thus, an increase in a resonance width due to dispersion of current is prevented, and also light loss is prevented from occurring during resonance due to the structure of a convention ridge in which the portion under the ridge is included in an optical waveguide. Therefore, the value of critical current for laser oscillation can be further lowered.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENT

Figure 1:
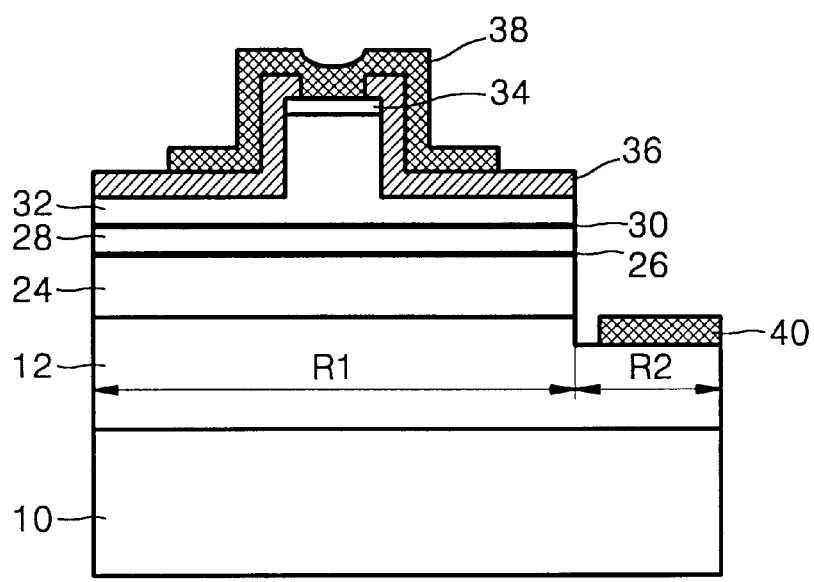
FIG. 1 is a cross-section of a semiconductor laser diode including a conventional ridge wave guide.
Figure 2:
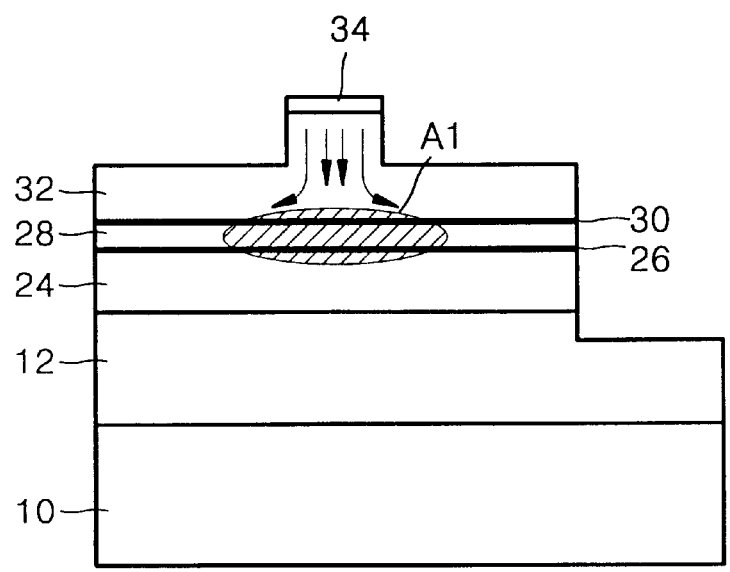
FIGS. 2 and 3 are cross-sections of a semiconductor laser diode including a conventional ridge wave guide, which show generable problems.
Figure 3:
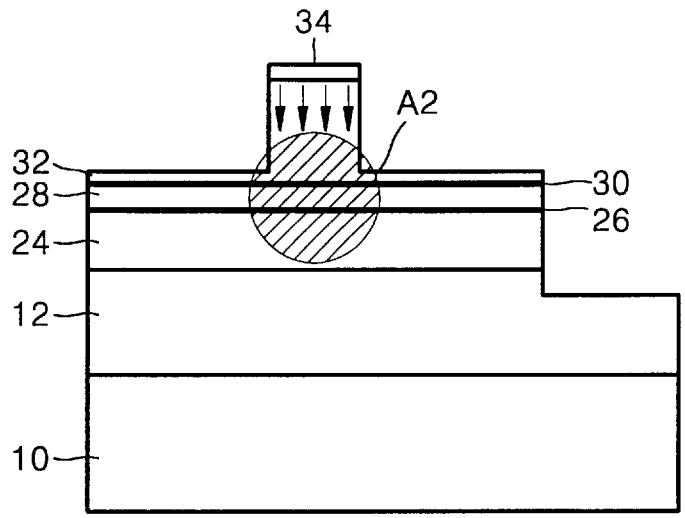

A semiconductor laser diode including a ridge waveguide according to an embodiment of the present invention and a method of manufacturing the semiconductor laser diode will now be described in detail with reference to the attached drawings. In the drawings, the thicknesses of layers or regions are exaggerated for clarity.

Figure 4:
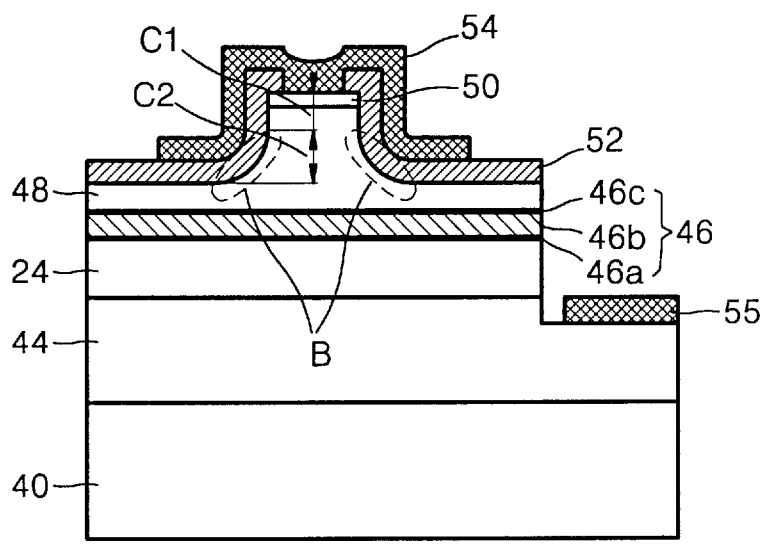
FIG. 4 is a cross-section of a semiconductor laser diode including a ridge wave guide according to an embodiment of the present invention.

First, a semiconductor laser diode including a ridge waveguide according to an embodiment of the present invention will be described with reference to FIGS. 4 through 6. Referring to FIG. 4, a first compound semiconductor layer 42 is formed on a high resistive substrate 40. The high resistive substrate 40 is a sapphire substrate in the exemplary embodiment. Preferably, the first compound semiconductor layer 42, which is a GaN-based III-V-group nitride compound semiconductor layer, is a direct transition type semiconductor layer. More preferably, the first compound semiconductor layer 42 is an n-GaN layer. The first compound semiconductor layer 42 can be a different III-V-group compound semiconductor layer in which laser can be emitted. Since the type of transition does not need to be limited, the first compound semiconductor layer 42 can be an indirect transition type material layer which is included in the group of the above-described compound semiconductor layers. A part of the first compound semiconductor layer 42 is etched to a predetermined depth, and a conductive layer 55 is formed on the etched region. The conductive layer 55 serves as an n-type electrode. The other region of the first compound semiconductor layer 42 having a step difference with the etched portion has a first cladding layer 44 formed thereon. Preferably, the first cladding layer 44 is an n-AlGaN/GaN layer having a predetermined refractive index. However, the first cladding layer 44 can be a semiconductor layer formed of a different compound in which stimulated emission occurs.

A resonator layer 46 is formed on the first cladding layer 44. The resonator layer 46, in which stimulated emission actually occurs, is made up of a first waveguiding layer 46a, an active layer 46b and a second waveguiding layer 46c which are sequentially formed on the first cladding layer 44. The first and second wave guiding layers 46a and 46c have lower refractive indices than the active layer 46b, and are preferably GaN-based III-V-group compound semiconductor layers.

More preferably, the first and second wave guiding layers 46a and 46c are an n-GaN layer and a p-GaN layer. The active layer 46b can be any material layer in which stimulated emission can occur. However, it is preferable that the active layer 46b is a material layer in which laser having a low critical current value and a stable horizontal mode property can be obtained. More preferably, the active layer 46b is formed of aluminum gallium nitride in which aluminum Al is contained at a predetermined percentage.

A second cladding layer 48 having a lower refractive index than the second wave guiding layer 46c is formed on the resonator layer 46, and has a ridge protruding in a direction perpendicular to the surface of the resonator layer 46. The ridge has a second compound semiconductor layer 50 formed thereon. The second cladding layer 48 is the same as the first cladding layer 44 except for the difference in implanted conductive impurities. Thus, if the first cladding layer 44 is an n-type compound semiconductor layer, as described above, the second cladding layer 48 is a compound semiconductor layer doped with p-type conductive impurities but having the same characteristics as the first cladding layer 44. If the first cladding layer 44 is a p-type compound semiconductor layer, the second cladding layer 48 is a compound semiconductor layer doped with n-type conductive impurities but having the same characteristics as the first cladding layer 44. This rule is also applied to the second compound semiconductor layer 50. Thus, if the second compound semiconductor layer 50 is a p-type compound semiconductor layer, the first compound semiconductor layer 42 is a compound semiconductor layer doped with n-type conductive impurities but having the same characteristics as the second compound semiconductor layer 50.

The ridge has at least two sides, each of which has a varying gradient, e.g., a rounded shape. For example, the ridge is made up of a first portion C1 having a first gradient and a second portion C2 having a different gradient than the first portion C1 in the direction of the resonator layer 46 having an active layer. The sides of the first portion C1 are ideally exactly perpendicular to the surface of the active layer, but may not be exactly perpendicular to the surface of the active layer during manufacturing. The second portion C2 has a slanting portion B at both sides. In the ridge, the ratio C2/C1 of the second portion C2, the width of which increases in the direction of the active layer, to the first portion C1, the width of which is constant, can be a maximum of about 2/1. However, it is preferable that the ratio C2/C1 is about 1/2 or 1/3, and it can be as low as 1/10. The first and second portions C1 and C2 are consecutive. The second compound semiconductor layer 50 is formed on the entire upper surface of the first portion C1 of the second cladding layer 48.

Preferably, the first portion C1 starts from the upper surface of the ridge of the second cladding layer 48. However, in this specification, on the basis of the characteristics of a manufacturing process in which the ridge is formed after the second compound semiconductor layer 50 is deposited, the first portion C1 is considered as starting from the surface of the second compound semiconductor layer 50 by considering the second compound semiconductor layer 50 as a part of the ridge for convenience's sake. Inclusion of the second compound semiconductor layer 50 in the ridge changes nothing in the characteristics of the laser diode.

The upper surface of the second cladding layer 48 is covered with a protective layer 52 which extends a predetermined distance up both ends of the second compound semiconductor layer 50 and thus symmetrically contacts the second compound semiconductor layer 50. A conductive layer 54 which contacts a portion of the second compound semiconductor layer 50 is formed on the protective layers 52. The conductive layer 54 is a p-type electrode.

Meanwhile, though not shown in the drawings, there may be a laser diode designed so that a ridge has the above-described characteristics and also electrodes are formed over and under the resonator layer 46, respectively, to face each other. For example, the high resistive substrate 40 can be replaced with silicon carbon (SiC), and an n-type electrode can be installed on the bottom surface of the high resistive substrate 40 to face a p-type electrode.

Figure 5:
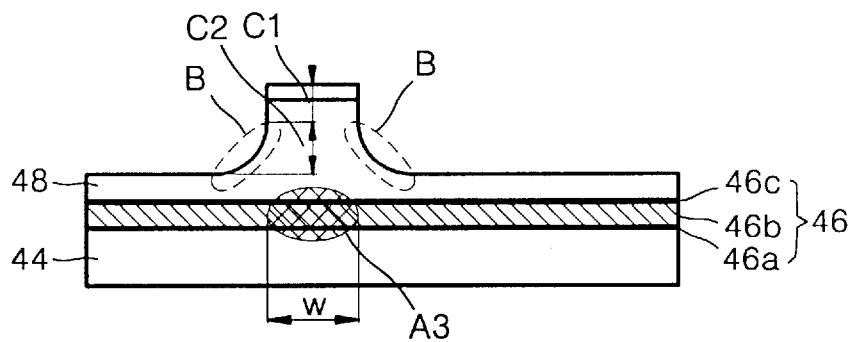
FIG. 5 is a cross-section of the semiconductor laser diode including a ridge wave guide of FIG. 4, which shows the lasing characteristics of the semiconductor laser diode.

Referring to FIG. 5, in the semiconductor laser diode according to an embodiment of the present invention, the ridge and the horizontal region of the second cladding layer 48 do not meet at a right angle but with a gentle inclination. Thus, spreading of current implanted via the second compound semiconductor layer formed on the upper surface of the ridge is prevented by the first portion C1 of the ridge. Thus, as can be seen from a near field pattern A3, a resonance width W is limited to the width of the ridge, and the occurrence of light loss due to the structure of a conventional ridge in which the portion under the ridge is included in an optical waveguide during resonance is prevented.

According to these characteristics, the critical current value of a semiconductor laser diode according to an embodiment of the present invention can also be predicted to be reduced as compared to a conventional semiconductor laser diode. This prediction can be ascertained from FIG. 6.

Figure 6:
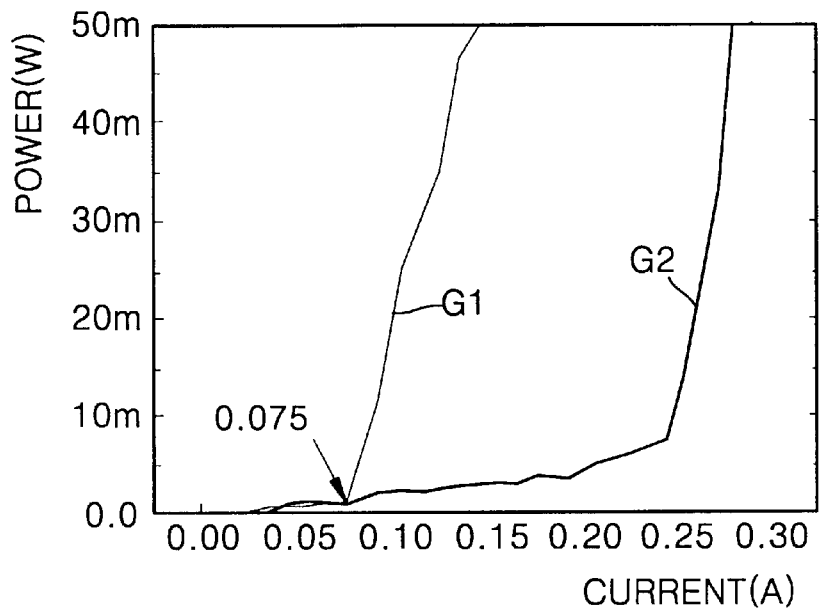
FIG. 6 is a graph showing the electrical property of a semiconductor laser diode including a conventional ridge waveguide and that of a semiconductor laser diode including a ridge waveguide according to the present invention.

FIG. 6 is a graph showing the critical current value of a semiconductor laser diode according to an embodiment of the present invention as described above and that of the conventional semiconductor laser diode of FIG. 1. In FIG. 6, a first graph G1 shows the critical current value of a laser diode according to the present invention, and a second graph G2 shows the critical current value of a conventional laser diode.

Referring to the first and second graphs G1 and G2, it can be seen that effective laser oscillation started in the conventional semiconductor laser diode at about 250 mA, and that effective laser oscillation started in the semiconductor laser diode according to the present invention at about 75 mA.

Consequently, a laser diode according to an embodiment of the present invention had the above-described advantages and also had a critical current value which is significantly smaller than that of a conventional laser diode.

Figure 7:
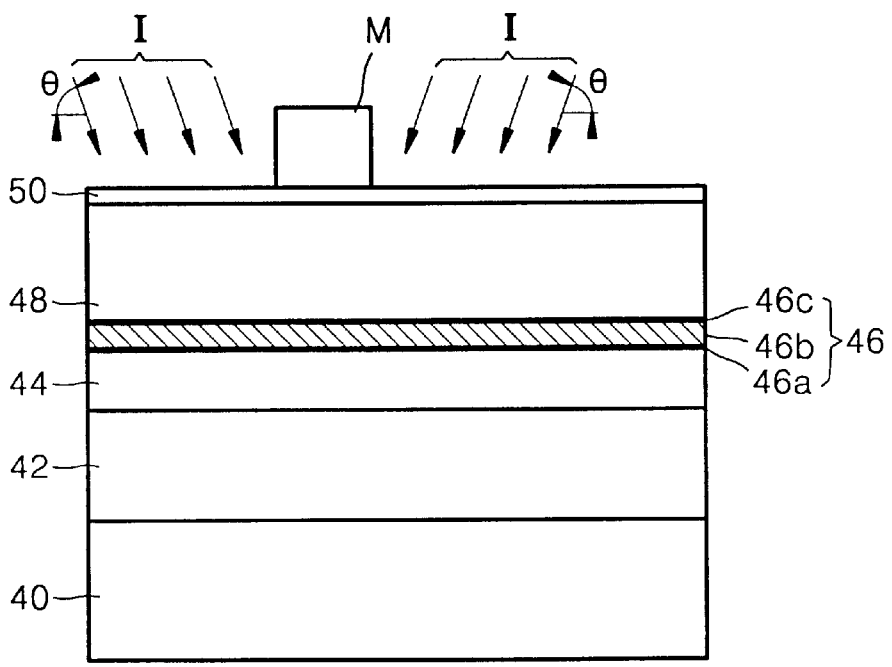
FIGS. 7 through 11 are cross-sectional views illustrating a method of manufacturing the semiconductor laser diode including the ridge waveguide shown in FIG. 4.

A method of manufacturing the above-described semiconductor laser diode according to an embodiment of the present invention will now be described. Referring to FIG. 7, first material layers 42 and 44 in which stimulated emission occurs, a resonator layer 46 and second material layers 48 and 50 in which stimulated emission occurs are formed on a high resistive substrate 40. Preferably, the high resistive substrate 40 is a sapphire substrate, and the first material layers 42 and 44 are formed by sequentially forming a first compound semiconductor layer 42 and a first cladding layer 44 on the high resistive substrate 40. Preferably, the first compound semiconductor layer 42 is formed of a III-V-group compound, for example, a GaN-based nitride compound semiconductor layer of a direct transition type. For example, it is preferable that the first compound semiconductor layer 42 is formed of n-GaN. Preferably, the first cladding layer 44 is formed of n-AlGaN/GaN. The resonator layer 46 is obtained by sequentially forming a first waveguiding layer 46a, an active layer 46b and a second waveguiding layer 46c on the first cladding layer 44. Preferably, the first and second waveguiding layers 46a and 46b are compound semiconductor layers doped with opposite conductivity type impurities, the layers having refractive indices which are higher than that of the first cladding layer 44 and lower than that of the active layer 46b. For example, it is preferable that the first waveguiding layer 46a is formed of n-GaN, and that the second waveguiding layer 46c is formed of p-GaN. The active layer 46b is a III-V-group compound semiconductor layer in which stimulated emission can occur or a compound semiconductor layer in which a predetermined active material is added to the III-V-group compound semiconductor compound. Preferably, the active layer 46b is a GaN-based III-V-group nitride compound semiconductor layer in which aluminum is contained at a predetermined percentage. For example, it is preferable that the active layer 46b is formed of AlGaN.

The second material layers 48 and 50 for laser oscillation are formed by 5 sequentially forming a second cladding layer 48 and a second compound semiconductor layer 50, both having lower refractive indices than the second waveguiding layer 46c, on the resonator layer 46. The second cladding layer 48 is a compound semiconductor layer which is the same as the first cladding layer except for the type of implanted conductive impurities. For example, it is preferable that the second cladding layer 48 is formed of p-AlGaN/GaN. Preferably, the second compound semiconductor layer 50 is the same as the first compound semiconductor layer 42 except that it is doped with different conductivity type impurities. Thus, it is preferable that the second compound semiconductor layer 50 is formed of p-type GaN.

Figure 8:
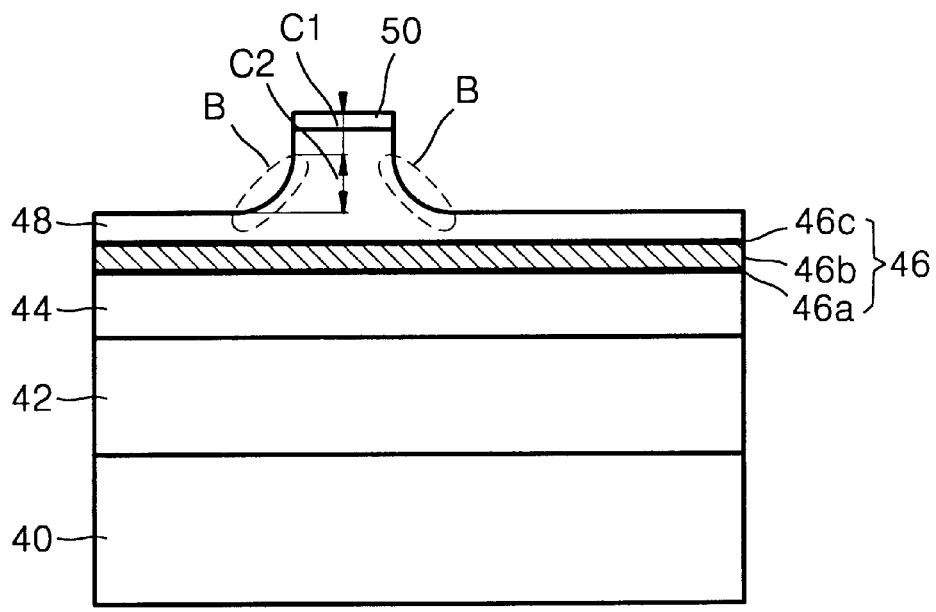

Next, a mask layer (not shown) is formed on the entire surface of the second compound semiconductor layer 50 and then patterned, thereby forming a mask pattern M which covers a predetermined region of the second compound semiconductor layer 50 and exposes the other region. The mask pattern M can be a soft mask pattern, for example, a photosensitive film pattern, or a hard mask pattern, for example, a molybdenum (Mo) pattern or a silicon oxide film ($SiO_2$) pattern. This mask pattern M is used as an etch mask when the second compound semiconductor layer 50 and the second cladding layer 48 are sequentially etched. Preferably, the second compound semiconductor layer 50 and the second cladding layer 48 are dry-etched. More preferably, the second compound semiconductor layer 50 and the second cladding layer 48 are etched by slant-radiating an etch ion beam I at a predetermined angle ($\theta$) toward the surface of the second compound semiconductor layer 50. Preferably, the etch ion beam I is slantedly radiated at an angle of about 10 to 70°, and more preferably at an angle of about 30°. This slant radiation condition can be obtained by controlling the position of an etch apparatus or controlling the position of a wafer stage. Under this slant radiation condition, etching is performed until the exposed portion of the second compound semiconductor layer 50 is etched and the exposed portion of the second cladding layer 48 has a predetermined thickness. Thereafter, the mask pattern M is removed. Since the second cladding layer 48 is etched to a predetermined depth except for a portion covered with the mask pattern M, the portion of the second cladding layer 48 covered with the mask pattern M has a protrusion shape as shown in FIG. 8, after the mask pattern M is removed. In this way, the second cladding layer 48 is formed with a ridge wave guide, a part of which protrudes perpendicularly to the surface of the resonator layer 46 and on which the second compound semiconductor layer 50 is formed.

Referring to FIG. 8, the protruding portion of the second cladding layer 48, that is, a ridge, is formed to have a first portion C1, the side of which has a first gradient, and a second portion C2, the side of which has a second gradient different from the first angle. Preferably, the second portion C2 is formed so that its width increases as it becomes closer to the resonator layer 46. Preferably, the etching of the second cladding layer 48 is performed so that the ratio of the second portion C2 to the first portion C1, C2/C1, is no greater than 2/1. Thus, even though the ridge can be formed so that the ratio C2/C1 is 1/1, it is more preferable that the ridge is formed so that the ratio C2/C1 is 1/2 or 1/3. Due to the above-described characteristics of the second portion C2, the side of the second portion C2 has a gentle slope B through which the first portion C1 is connected to the horizontal region of the second cladding layer 48.

Because of the gentle slope B, which is a characteristic of slant radiation etching, some of an ion beam radiated on the lateral surface of the ridge is reflected after colliding with the lateral surface of the ridge, and thus collides with the surface of a portion of the second cladding layer 48 which is somewhat far from the ridge.

Therefore, the portion of the second cladding layer 48 that is somewhat far from the ridge is etched faster than the portion of the second cladding layer 48 that is close to the ridge, resulting in a ridge having the above-described characteristics.

Figure 9:
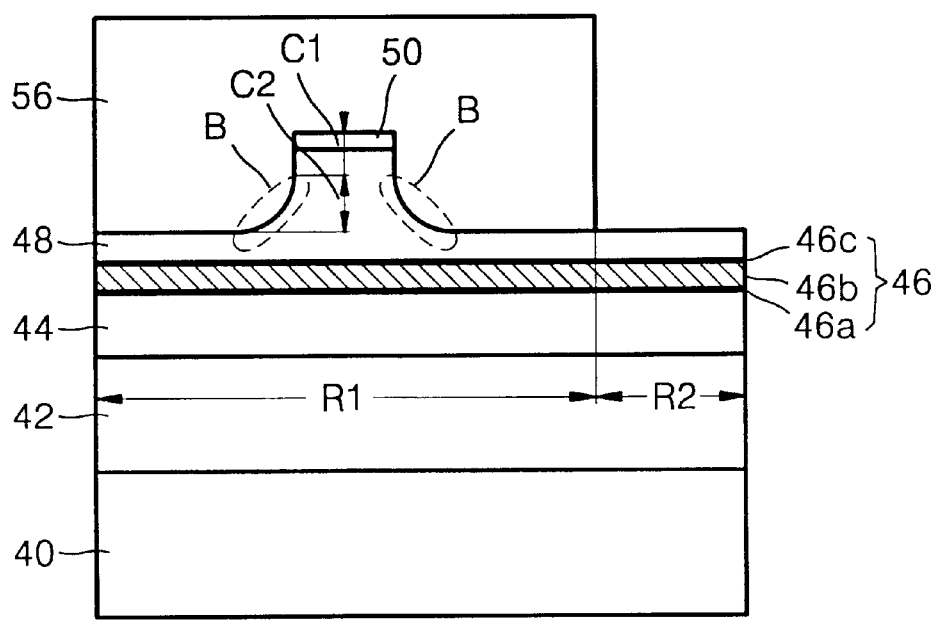

Referring to FIG. 9, a first region R1 including the ridge and a second region R2 not including the ridge are set up in the second cladding layer 48. This region establishment is also applied to the material layer under the second cladding layer 48, for example, to the first compound semiconductor layer 42. Next, a photosensitive film (not shown) is formed on the entire surface of the second cladding layer 48 to have a thickness enough to cover the ridge, and then patterned, thereby forming a photosensitive film pattern 56 which exposes the second region R2. The second region R2 in the second cladding layer 48 and the material layer under the second region R2 are successively etched using the photosensitive film pattern 56 as an etch mask. Here, this etching is performed until a portion of the first compound semiconductor layer 42, which corresponds to the second region R2, has a predetermined thickness. Thereafter, the photosensitive pattern 56 is removed.

Figure 10:
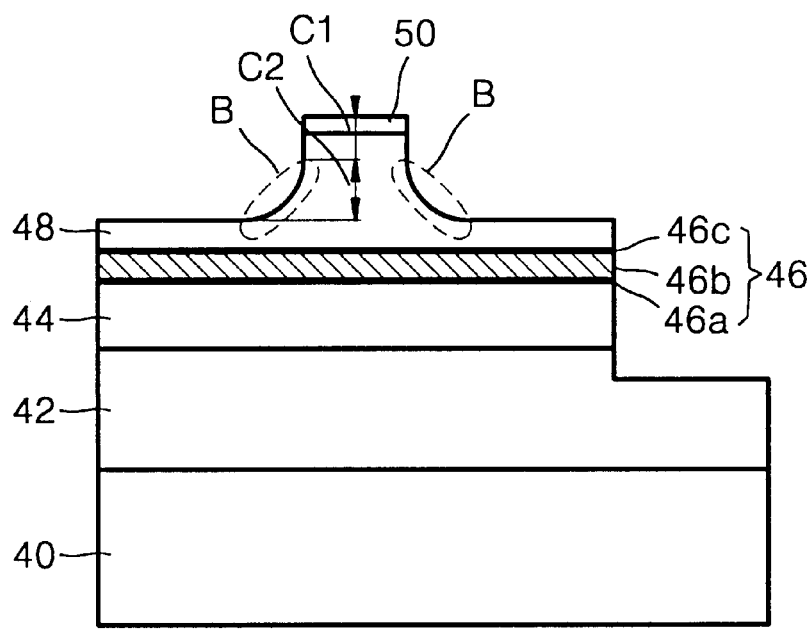
Figure 11:
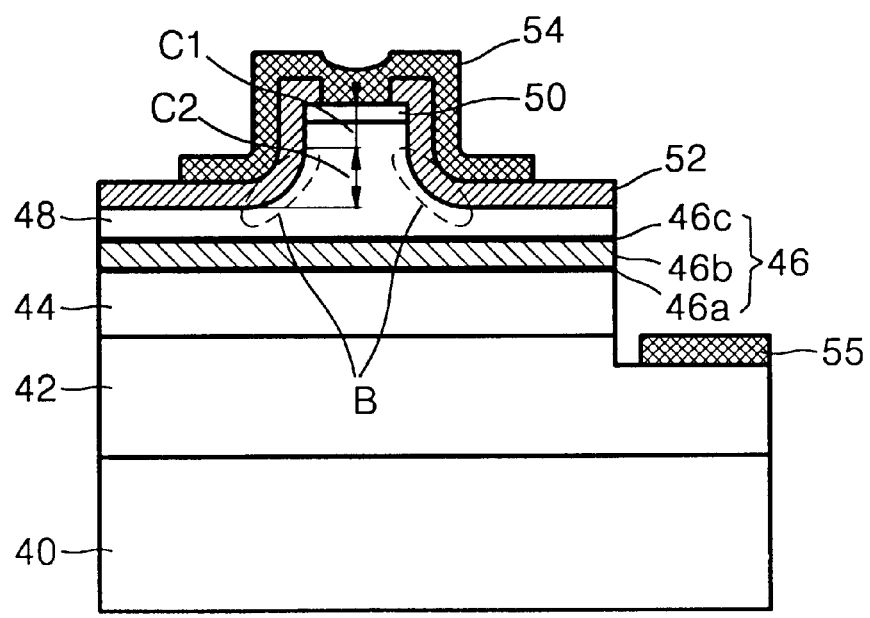

Thus, as shown in FIG. 10, the second regions R2 of the material layers sequentially formed on the first compound semiconductor layer 42 are removed, and the second region R2 of the first compound semiconductor layer 42 is also etched to a predetermined thickness, so that a step difference is formed between the first and second regions R1 and R2 of the first compound semiconductor layer 42. Then, as shown in FIG. 11, a protective film 52 is formed on the second cladding layer 48 so that it extends up to some surface areas of the second compound semiconductor layer 50 and symmetrically contacts the second compound semiconductor layer 50. A conductive layer 54 is formed on the protective layers 52 so that it contacts the second compound semiconductor layer 50. The etched region of the first compound semiconductor 42 also has a conductive layer 55 formed thereon to be isolated from the resonator layer 46. The conductive layer 54 is used as a p-type electrode which contacts the material layers 48 and 50 in which stimulated emission occurs, the material layers 48 and 50 being formed on the resonator layer 46. The conductive layer 55 is used as an n-type electrode which contacts the material layers 42 and 44 in which stimulated emission occurs, the material layers 42 and 44 being formed between the high resistive substrate 40 and the resonator layer 46.

Though not shown in the drawings, electrodes can be formed over and under a resonator layer, respectively. For example, the material of the high resistive substrate 40 is replaced with silicon carbon SiC, and, in this state, a conductive layer 55 serving as an n-type electrode can be formed on the bottom surface of the SiC substrate.

Although the invention has been described with reference to a particular embodiment, this embodiment must not be interpreted as restricting the scope of the invention but as being a preferable example of the present invention. Thus, it will be apparent to one of ordinary skill in the art that various modifications to the described embodiment may be made without departing from the spirit and scope of the invention. For example, the structure of a resonator layer or material layers in which stimulated emission occurs can vary while the above-described characteristics of a ridge are maintained. The spirit of the present invention can also be applied to various types of laser diodes such as gain waveguide laser diodes or refractive waveguide laser diodes.

As described above, in a semiconductor laser diode having a ridge wave guide according to the present invention, a ridge is made up of a portion whose width is uniform and a portion which is connected from the portion having a uniform width and whose width increases as being closer to an active layer. Thus, an increase in a resonance width due to dispersion of current is prevented, and also light loss is prevented from being generated during resonance due to the structure of a conventional ridge in which the portion under the ridge is included in an optical waveguide. Therefore, the value of critical current for laser oscillation can be further lowered.

What is claimed is:

1. A semiconductor laser diode comprising:

an active layer in which stimulated emission occurs;

a first and a second material layers located on either side of said active layer and having lower refractive indices than said active layer;

a ridge protruding perpendicularly away from said active layer and located on one of said first and second material layers;

an electrode located on said ridge, wherein said ridge has two opposing sides, each side including at least two portions having different gradients.

2. The semiconductor laser diode of claim 1, wherein a portion of the ridge that is close to the active layer becomes wider as it gets closer to the active layer.

3. The semiconductor laser diode of claim 2, wherein the ratio of a portion C2 of the ridge, the width of which increases in the direction of the active layer, to a portion C1, the width of which is constant, C2/C1, is no greater than 2/1.

4. The semiconductor laser diode of claim 3, wherein the ratio of the portion C2 of the ridge, the width of which increases in the direction of the active layer, to the portion C1, the width of which is constant, C2/C1, is 1/2.

5. The semiconductor laser diode of claim 1, wherein the first material layer in which stimulated emission occurs comprises:

a first compound semiconductor layer formed on a substrate;

a first cladding layer formed on the first compound semiconductor layer; and a first waveguiding layer formed on the first cladding layer, the first waveguiding layer having a greater refractive index than the first cladding layer.

6. The semiconductor laser diode of claim 1, wherein the second material layer in which stimulated emission occurs comprises:

a second waveguiding layer formed on the active layer;

a second cladding layer formed on the second waveguiding layer, the second cladding layer having a smaller refractive index than the second waveguiding layer and including the ridge; and a second compound semiconductor layer formed on the entire upper surface of the ridge.

7. The semiconductor laser diode of claim 5, wherein an electrode having a different conductivity type from the electrode formed on the ridge is formed on the first compound semiconductor layer.

8. The semiconductor laser diode of claim 5, wherein an electrode having a different conductivity type from the electrode formed on the ridge is formed on the bottom surface of the substrate.

9. The semiconductor laser diode of claim 1, wherein the substrate is a highly resistive sapphire substrate.

10. The semiconductor laser diode of claim 5, wherein the substrate is formed of silicon carbon SiC or gallium nitride GaN.

11. A method of manufacturing a semiconductor laser diode, comprising the steps of:

forming an active layer in which stimulated emission occurs;

forming a first and a second material layers located on either side of said active layer and having lower refractive indices than said active layer;

forming a ridge protruding perpendicularly away from said active layer and located on one of said first and second material layers;

forming an electrode located on said ridge;

wherein said ridge has two opposing sides, each side including at least two portions having different gradients.

12. The method of claim 11, further comprising the step of forming a portion (C2) of the ridge such that the closer to the active layer a ridge side gets the wider the ridge side is.

13. The method of claim 11, further comprising the step of forming the ridge so that the ratio of a portion C2 of the ridge, the width of which gradually increases in the direction of the active layer, to a portion C1, the width of which is constant, C2/C1, is no greater than 2/1.

14. The method of claim 13, wherein the ridge is formed so that the ratio C2/C1 of the portion C2 of the ridge, the width of which gradually increases in the direction of the active layer, to the portion C1, the width of which is constant, is 1/2.

15. The method of claim 11, wherein the ridge is formed by the steps of:

forming a mask pattern used to form the ridge, on the first material layer;

etching the second material layer until the second material layer has a predetermined thickness, using the mask pattern as an etch mask; and removing the mask pattern, wherein the second material layer is etched by slant-radiating an ion beam onto the surface of the second material layer at a predetermined angle.

16. The method of claim 15, wherein the slant radiation angle is 10 to 70°.

17. The method of claim 15, wherein the slant radiation angle is 30°.

18. The method of claim 11, further comprising:

forming a first compound semiconductor layer on a substrate;

forming a first cladding layer on the first compound semiconductor layer; and forming a first waveguiding layer on the first cladding layer, the first waveguiding layer having a greater refractive index than the first cladding layer.

19. The method of claim 11, wherein the second material layer in which stimulated emission occurs is formed by the steps of:
   forming a second waveguiding layer on the active layer;
   forming a second cladding layer on the second waveguiding layer, the second cladding layer having a smaller refractive index than the second waveguiding layer and including the ridge; and
   forming a second compound semiconductor layer on the entire upper surface of the ridge.

20. The method of claim 18, wherein an electrode having a different conductivity type from the electrode formed on the ridge is formed on the first compound semiconductor layer so that it is isolated from the active layer.

21. The method of claim 18, wherein an electrode having a different conductivity type from the electrode formed on the ridge is formed on the bottom surface of the substrate.

* * * * *